United States Patent
Ishii et al.

(10) Patent No.: US 7,629,539 B2
(45) Date of Patent: Dec. 8, 2009

(54) WIRED CIRCUIT BOARD

(75) Inventors: Jun Ishii, Osaka (JP); Yasunari Ooyabu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/819,596

(22) Filed: Jun. 28, 2007

(65) Prior Publication Data

US 2008/0000673 A1 Jan. 3, 2008

Related U.S. Application Data

(60) Provisional application No. 60/818,525, filed on Jul. 6, 2006.

(30) Foreign Application Priority Data

Jun. 29, 2006 (JP) .............................. 2006-179846

(51) Int. Cl.
*H05K 1/00* (2006.01)
(52) U.S. Cl. .................................... 174/254; 360/245.9
(58) Field of Classification Search ................. 174/254, 174/260, 261; 360/245.9
See application file for complete search history.

(56) References Cited

U.S. PATENT DOCUMENTS

| | | | |
|---|---|---|---|
| 6,316,734 B1 * | 11/2001 | Yang | 174/256 |
| 6,801,402 B1 * | 10/2004 | Subrahmanyam et al. | 360/245.9 |
| 2003/0089520 A1 | 5/2003 | Ooyabu et al. | |
| 2004/0221447 A1 | 11/2004 | Ishii et al. | |
| 2006/0190673 A1 * | 8/2006 | Arai et al. | 711/101 |

FOREIGN PATENT DOCUMENTS

| | | |
|---|---|---|
| JP | 2003-152383 | 5/2003 |
| JP | 2004-035825 | 2/2004 |
| JP | 2004-335700 | 11/2004 |
| JP | 2006-134421 | 5/2006 |

* cited by examiner

*Primary Examiner*—Ishwar I. B. Patel
(74) *Attorney, Agent, or Firm*—Jean C. Edwards, Esq.; Akerman Senterfitt

(57) ABSTRACT

A wired circuit board has a metal supporting board, an insulating layer formed on the metal supporting board, a conductive pattern formed on the insulating layer and having a plurality of wires arranged in mutually spaced-apart relation, and a plurality of semiconductive layers formed on the insulating layer and electrically connected to the metal supporting board and the respective wires. The semiconductive layers are provided independently of each other in correspondence to the respective wires.

2 Claims, 10 Drawing Sheets

FIG. 4
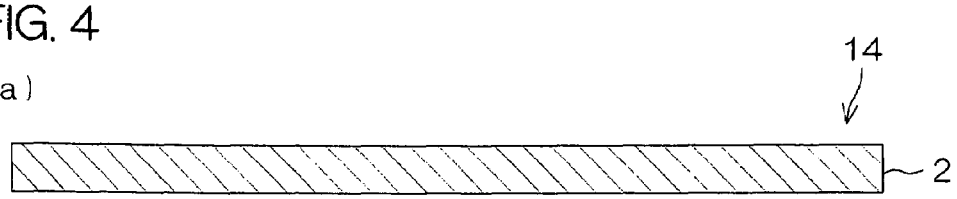
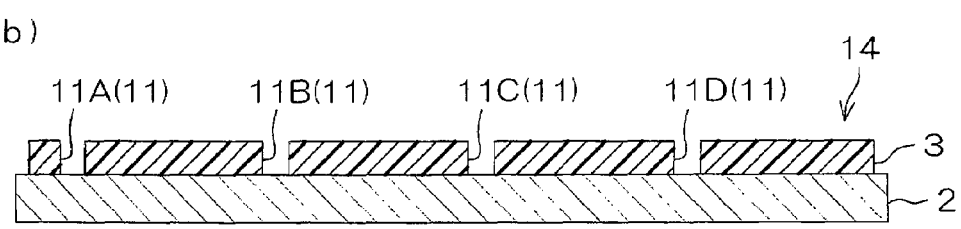
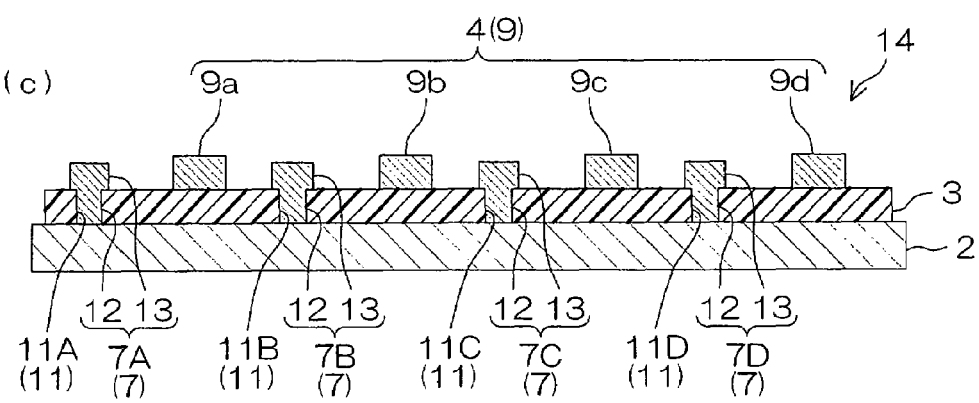
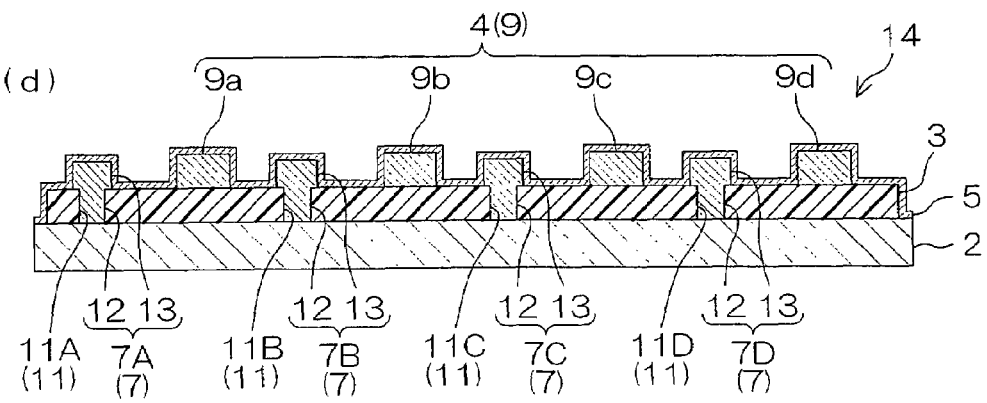

WIRED CIRCUIT BOARD

CROSS-REFERENCE TO RELATED APPLICATION

This patent application claims the benefit of U.S. Provisional Application No. 60/818,525, filed on Jul. 6, 2006, and claims priority from Japanese Patent Application No. 2006-179846, filed on Jun. 29, 2006, the contents of which are herein incorporated by reference in their entirety.

BACKGROUND OF THE INVENTION

1. Field of the Invention

The present invention relates to a wired circuit board and, more particularly, to a wired circuit board such as a suspension board with circuit on which an electronic component is mounted.

2. Description of the Related Art

A wired circuit board such as a suspension board with circuit includes, e.g., a metal supporting board made of a stainless steel foil or the like, an insulating base layer made of a polyimide resin or the like and formed on the metal supporting board, a conductive pattern made of a copper foil or the like, having a plurality of wires, and formed on the insulating base layer, and an insulating cover layer made of a polyimide resin or the like and formed on the insulating base layer to cover the conductive pattern. Such a wire circuit board is widely used in the field of various electric and electronic equipment.

To prevent electrostatic breakdown of an electronic component mounted on such a wire circuit board, it has been proposed to form a semiconductive layer by successively laminating a metal thin film and a metal oxide layer on the surfaces of the insulating cover layer and the insulating base layer of a suspension board with circuit and remove the electrostatic charging by means of the semiconductive layer (see, e.g., Japanese Unexamined Patent Publication No. 2004-335700).

It has also been proposed to form a semiconductive layer on the surface of an insulating layer, form through holes extending through the insulating layer and the semiconductive layer to expose a conductive layer, form connection terminals in the through holes to bring the semiconductive layer into contact with the connection terminals to remove the electrostatic charging of the insulating layer and the conductive layer (see, e.g., Japanese Unexamined Patent Publication No. 2003-152383).

SUMMARY OF THE INVENTION

However, in Japanese Unexamined Patent Publication No. 2004-335700, the semiconductive layer formed only on the surfaces of the insulating cover layer and the insulating base layer is insufficient to remove the electrostatic charging of the conductive layer, resulting in that the electrostatic breakdown of a mounted electronic component can not be prevented reliably.

In Japanese Unexamined Patent Publication No. 2003-152383, the semiconductive layer is in contact with the connection terminals, not with the conductive layer. When the connection terminals are not formed, the electrostatic charging of the conductive layer cannot be removed.

Therefore, it is proposed that in a suspension board with circuit 31, e.g., a semiconductive layer 35 is continuously formed between an insulating cover layer 36 and the respective surfaces of a conductive pattern 34, an insulating base layer 33, and a metal supporting board 32 at the same position as the insulating cover layer 36 when viewed in plan view, as shown by the hatched portions of FIG. 11 and FIG. 12 to remove the electrostatic charging of the conductive pattern 34 by means of the semiconductive layer 35.

However, in the suspension board with circuit 31 in which such a semiconductive layer 35 is formed, there may be a case where a conductive material forming the conductive pattern 34 migrates (ion migration) between a plurality of wires 37 (between wires 37a, 37b, 37c, and 37d) along the semiconductive layer 35, resulting the short circuit of the conductive pattern 34.

It is therefore an object of the present invention to provide a wired circuit board which allows efficient removal of the electrostatic charging of a conductive pattern and reliable prevention of the short circuit thereof.

A wired circuit board according to the present invention comprises a metal supporting board, an insulating layer formed on the metal supporting board, a conductive pattern formed on the insulating layer and having a plurality of wires arranged in mutually spaced-apart relation, and a plurality of semiconductive layers formed on the insulating layer and electrically connected to the metal supporting board and the respective wires, wherein the semiconductive layers are provided independently of each other in correspondence to the respective wires.

In the wired circuit board according to the present invention, it is preferable that each of the semiconductive layers is in contact with the metal supporting board.

In the wired circuit board according to the present invention, it is preferable that a plurality of openings are formed in the insulating layer to extend through in a thickness direction in correspondence to the respective wires, and a plurality of ground connection portions are formed on the metal supporting board exposed from the respective openings in contact relation with the metal supporting board and the respective semiconductive layers.

The wired circuit board according to the present invention comprises the plurality of semiconductive layers electrically connected to the metal supporting board and the respective wires. Consequently, the conductive pattern is electrically connected to the metal supporting board via the plurality of semiconductive layers. This allows efficient removal of the electrostatic charging of the conductive pattern. In addition, in the wired circuit board according to the present invention, the semiconductive layers are provided independently of each other in correspondence to the respective wires, not continuously over the wires. Therefore, it is possible to reliably prevent the short circuit of the conductive pattern without causing a short circuit between the individual wires.

As a result, it is possible to reliably prevent the electrostatic breakdown of an electronic component mounted and also improve the connection reliability of the wired circuit board.

BRIEF DESCRIPTION OF THE DRAWINGS

FIG. 4 is a cross-sectional view showing the steps of producing the suspension board with circuit shown in FIG. 3, (a) showing the step of preparing a metal supporting board, (b) showing the step of forming an insulating base layer in a pattern in which a plurality of base openings are formed on the metal supporting board, (c) showing the step of simultaneously forming a conductive pattern and ground connection portions, and (d) showing the step of continuously forming a semiconductive layer entirely on the surface of the conductive pattern, the surface of the upper parts of the ground connection portions, the surface of the insulating base layer, and the surface of the metal supporting board;

DETAILED DESCRIPTION OF THE INVENTION

Figure 1:
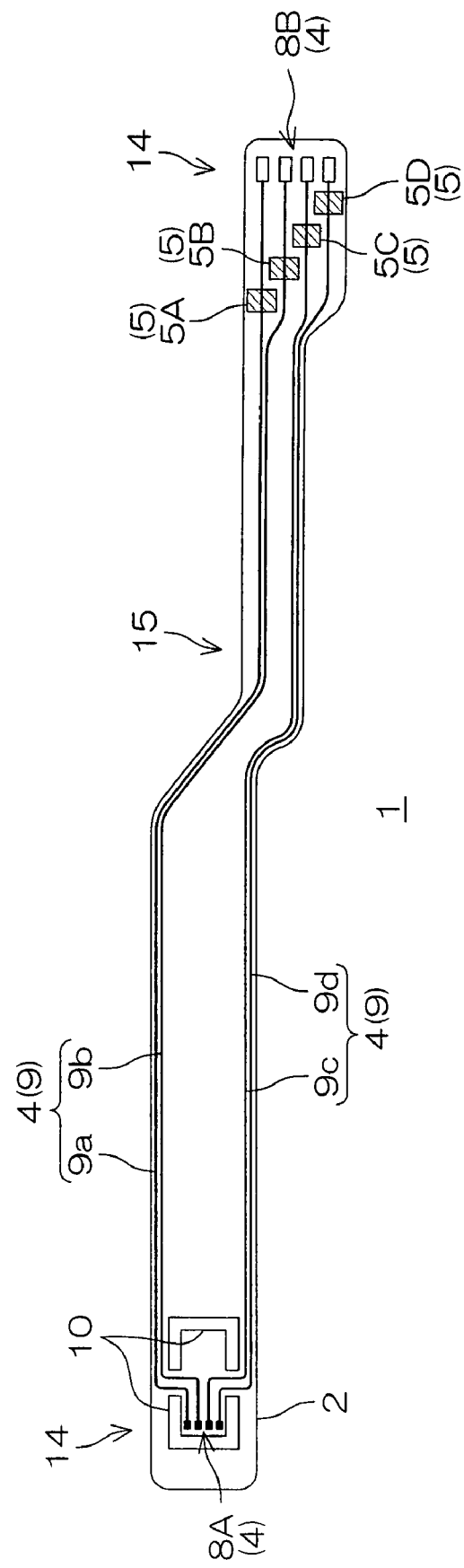
FIG. 1 is a schematic plan view showing a suspension board with circuit as a wired circuit board according to an embodiment (in which respective semiconductive layers are electrically connected to a metal supporting board via respective ground connection portions) of the present invention.
Figure 2:
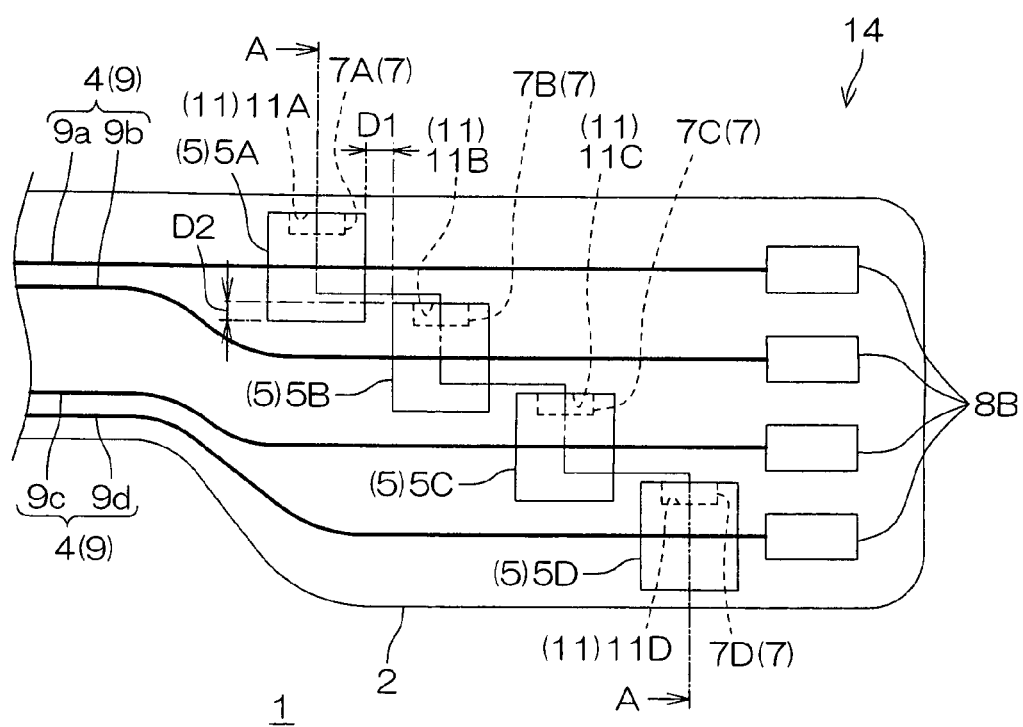
FIG. 2 is an enlarged plan view of a terminal portion formation region at the rear end side of the suspension board with circuit shown in FIG. 1.
Figure 3:
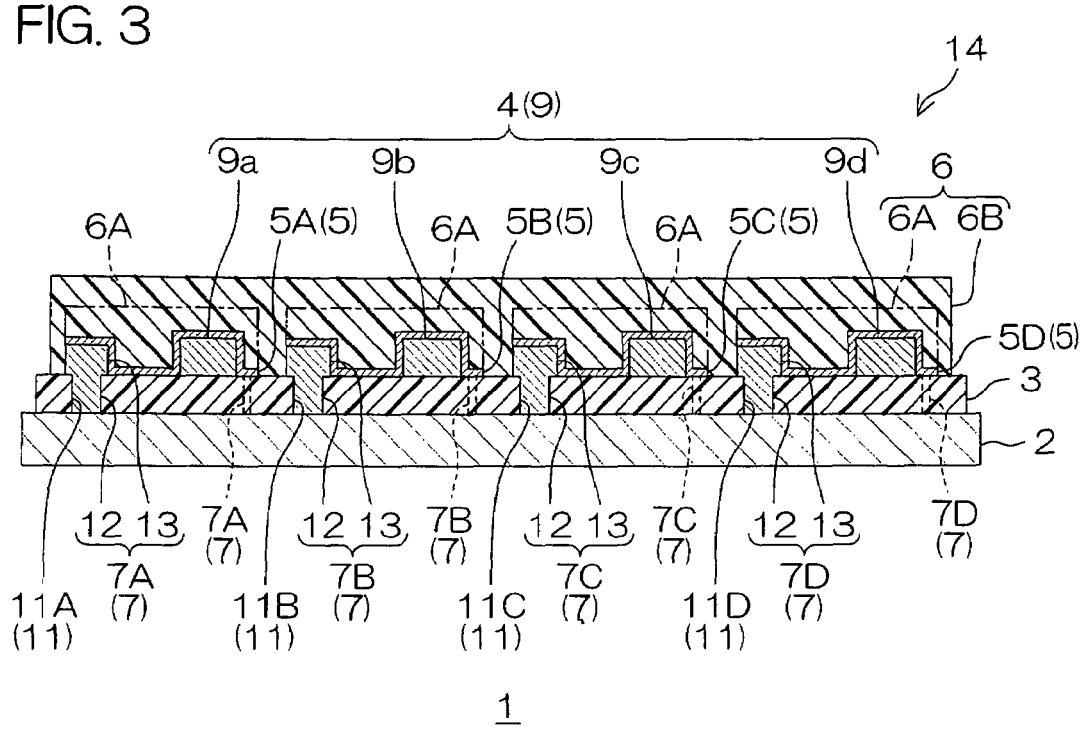
FIG. 3 is a cross-sectional view in a widthwise direction of the suspension board with circuit along the line A-A shown in FIG. 2.

FIG. 1 is a schematic plan view showing a suspension board with circuit as a wired circuit board according to an embodiment of the present invention. FIG. 2 is an enlarged plan view of a terminal portion formation region at the rear end side in a longitudinal direction (hereinafter simply referred to as the longitudinal direction) of the suspension board with circuit shown in FIG. 1. FIG. 3 is a cross-sectional view in a direction (hereinafter simply referred to as a widthwise direction) orthogonal to the longitudinal direction of the suspension board with circuit along the line A-A shown in FIG. 2. In FIGS. 1 and 2, an insulating base layer 3 and an insulating cover layer 6, each described later, are partly omitted for clear illustration of a relative position of a conductive pattern 4 to a metal supporting board 2.

In FIG. 1, a suspension board with circuit 1 includes the metal supporting board 2 mounted on a hard disk drive. The conductive pattern 4 connecting a magnetic head (not shown) and a read/write board is formed integrally on the metal supporting board 2. The metal supporting board 2 supports the magnetic head mounted thereon, while holding a minute gap between the magnetic head and a magnetic disk against an air flow caused when the magnetic head and the magnetic disk travel relatively to each other.

The conductive pattern 4 includes magnetic-head-side connection terminal portions 8A, external connection terminal portions 8B, and a plurality of wires 9 for connecting the magnetic-head-side connection terminal portions 8A and the external connection terminal portions 8B integrally and continuously.

The plurality of wires 9 are provided in the longitudinal direction of the metal supporting board 2 and arranged in mutually spaced-apart and parallel opposed relation in the widthwise direction of the metal supporting board 2.

The plurality of wires 9 are composed of one pair of wires 9a and 9b arranged in mutually parallel opposed relation on one widthwise side and the other pair of wires 9c and 9d arranged in mutually parallel opposed relation on the other widthwise side. Of the one pair of wires 9a and 9b, the one wire 9a is disposed outside in the widthwise direction and the other wire 9b is disposed inside in the widthwise direction. Of the other pair of wires 9c and 9d, the one wire 9c is disposed inside in the widthwise direction and the other wire 9d is disposed outside in the widthwise direction.

To the one pair of wires 9a and 9b, a read signal and a write signal having different potentials are respectively inputted so that a potential difference is constantly produced therebetween. As well as to the other pair of wires 9c and 9d, a read signal and a write signal having different potentials are respectively inputted so that a potential difference is constantly produced therebetween.

More specifically, each of the wires 9 is either a read wire for reading data on the magnetic disk or a write wire for writing data on the magnetic disk. The combination of each wire in a pair is selected such that the one wire 9a is a read wire and the other wire 9b is a write wire or vice versa in one pair, and the one wire 9c is a read wire and the other wire 9d is a write wire or vice versa in the other pair.

The plurality of magnetic-head-side connection terminal portions 8A are provided as wide lands and arranged in parallel at the front end portion of the metal supporting board 2 and connected individually to the respective front end portions of the wires 9. To the magnetic-head-side connection terminal portions 8A, terminal portions (not shown) of the magnetic head are connected.

The plurality of external connection terminal portions 8B are provided as wide lands and arranged in parallel at the rear end portion of the metal supporting board 2 and connected individually to the respective rear end portions of the wires 9. To the external connection terminal portions 8B, terminal portions (not shown) of the read/write board are connected.

The front end portion of the metal supporting board 2 is provided with a gimbal 10 for mounting the magnetic head. The gimbal 10 is formed by cutting out the metal supporting board 2 to sandwich the magnetic-head-side connection terminal portions 8A in the longitudinal direction.

As shown in FIG. 3, the suspension board with circuit 1 includes the metal supporting board 2, the insulating base layer 3 as an insulating layer formed on the metal supporting board 2, the conductive pattern 4 formed on the insulating base layer 3, ground connection portions 7 formed on the metal supporting board 2, semiconductive layers 5 formed on the insulating base layer 3 to cover the conductive pattern 4 and the ground connection portions 7, and the insulating cover layer 6 formed on the semiconductive layers 5.

The metal supporting board 2 is formed of a flat thin plate extending longitudinally in correspondence to the outer shape of the suspension board with circuit 1 described above.

The length (longitudinal length, hereinafter referred to as such) and width (widthwise length, hereinafter referred to as such) of the metal supporting board 2 are selected appropriately depending on the purpose and application.

As shown in FIG. 1, the metal supporting board 2 has the front end portion and the rear end portion as terminal portion formation regions in which the magnetic-head-side connection terminal portions 8A and the external connection terminal portions 8B are arranged, and has the portion interposed therebetween as a middle region 15 in which the midway portions of the respective wires 9 are arranged.

As shown in FIG. 3, the insulating base layer 3 is formed on the metal supporting board 2 to have a pattern in which the portions where the ground connection portions 7 are formed as well as the peripheral end portion of the metal supporting board 2 are exposed in correspondence to the portion where the conductive pattern 4 is formed.

To form the plurality of ground connection portions 7 (a first ground connection portion 7A, a second ground connection portion 7B, a third ground connection portion 7C, and a fourth ground connection portion 7D) in the rear-end-side terminal portion formation region 14, base openings 11 (a first base opening 11A, a second base opening 11B, a third base opening 11C, and a fourth base opening 11D) are formed as a plurality of openings in the insulating base layer 3 to extend through in the thickness direction and be correspondingly spaced apart from the respective wires (the outer wire 9a on one widthwise side, the inner wire 9b on one widthwise side, the inner wire 9c on the other widthwise side, and the outer wire 9d on the other widthwise side) each on one widthwise side (left-hand side in FIG. 3) thereof.

Each of the first ground connection portion 7A, the second ground connection portion 7B, the third ground connection portion 7C, and the fourth ground connection portion 7D is hereinafter simply described as the ground connection portion 7 when distinction therebetween is not particularly needed. Each of the wires 9a, 9b, 9c, and 9d is simply described as the wire 9 when distinction therebetween is not particularly needed. Each of the first base opening 11A, the second base opening 11B, the third base opening 11C, and the fourth base opening 11D is simply described as the base opening 11 when distinction therebetween is not particularly needed.

As indicated by the broken lines in FIG. 2, the base openings 11 are each formed in a generally rectangular shape extending in the longitudinal direction when viewed in plan view and are arranged along an oblique direction intersecting the widthwise direction and the longitudinal direction in such a manner as to not overlap each other in the widthwise direction and to be located at positions shifted from each other in the longitudinal direction.

The length and width of the insulating base layer 3 are selected appropriately depending on the purpose and application to define the shape described above.

The conductive pattern 4 is formed as a wired circuit pattern integrally including the plurality of wires 9 arranged on the insulating base layer 3 in mutually spaced-apart and parallel opposed relation as described above, the magnetic-head-side connection terminal portions 8A connected to the respective front end portions of the wires 9, and the external connection terminal portions 8B connected to the respective rear end portions of the wires 9. The magnetic-head-side connection terminal portions 8A and the external connection terminal portions 8B are hereinafter simply described as a terminal portion 8 when distinction therebetween is not particularly needed.

As shown in FIG. 1, the conductive pattern 4 is formed to have a shape in which the spacing between the individual wires 9 is larger in each of the terminal portion formation regions 14 than in the middle region 15.

The width of each of the wires 9 is in the range of, e.g., 10 to 100 μm, or preferably 15 to 50 μm. In the middle region 15, the spacing between the individual wires 9 is in the range of, e.g., 10 to 100 μm, or preferably 15 to 50 μm. In each of the terminal portion formation regions 14, the spacing between the individual wires 9 is in the range of, e.g., 50 to 1000 μm, or preferably 100 to 500 μm.

The width of each of the terminal portions 8 is in the range of, e.g., 20 to 1000 μm, or preferably 30 to 800 μm. The spacing between the individual terminal portions 8 is in the range of, e.g., 20 to 1000 μm, or preferably 30 to 800 μm.

The conductive pattern 4 is disposed in the rear-end-side terminal portion formation region 14 to secure the region where the base openings 11 are formed.

As shown in FIG. 3, the ground connection portions 7 are provided in correspondence to the respective base openings 11 of the insulating base layer 3 described above and each integrally and continuously includes a lower part 12 formed to fill in the corresponding base opening 11 and an upper part 13 formed to protrude upward in the thickness direction and extend out longitudinally in both directions and widthwise in both directions from the upper end of the lower part 12 in such a manner as to cover the surface of the insulating base layer 3 around the base opening 11.

The lower surface of the lower part 12 of the ground connection portion 7 is in contact with the metal supporting board 2.

The width of the lower part 12 of the ground connection portion 7 is in the range of, e.g., 40 to 2000 μm, or preferably 60 to 500 μm. The width of the upper part 13 of the ground connection portion 7 is in the range of, e.g., 70 to 2060 μm, or preferably 90 to 560 μm. The respective lengths of the lower part 12 and upper part 13 of the ground connection portion 7 are selected appropriately depending on the purpose and application and on the design of a product.

As necessary, the suspension board with circuit 1 includes a metal thin film, though not shown, to be interposed between each of the conductive pattern 4 and the ground connection portions 7 and each of the semiconductive layers 5 and the insulating cover layer 6 to cover the conductive pattern 4 and the ground connection portions 7 depending the purpose and application.

The metal thin film, which is not shown, is formed as necessary on the surfaces of the conductive pattern 4 and the upper part 13 of each of the ground connection portions 7, i.e., on the upper and side surfaces of each of the wires 9 of the conductive pattern 4 and the upper and side surfaces of the upper part 13 of each of the ground connection portions 7.

As shown in FIGS. 1 and 2, the semiconductive layers 5 include the plurality of (four) semiconductive layers, i.e., a first semiconductive layer 5A, a second semiconductive layer 5B, a third semiconductive layer 5C, and a fourth semiconductive layer 5D. Each of the first semiconductive layer 5A, the second semiconductive layer 5B, the third semiconductive layer 5C, and the fourth semiconductive layer 5D is hereinafter simply described as the semiconductive layer 5 when distinction therebetween is not particularly needed.

The individual semiconductive layers 5 (the first semiconductive layer 5A, the second semiconductive layer 5B, the third semiconductive layer 5C, and the fourth semiconductive layer 5D) are provided independently of each other in correspondence to the respective wires 9 (the wires 9a, 9b, 9c, and 9d).

That is, the semiconductive layers 5 are provided such that the first semiconductive layer 5A corresponds to the outer wire 9a on one widthwise side, the second semiconductive layer 5B corresponds to the inner wire 9b on one widthwise side, the third semiconductive layer 5C corresponds to the inner wire 9c on the other widthwise side, and the fourth semiconductive layer 5D corresponds to the outer wire 9d on the other widthwise side.

The semiconductive layers 5 are each formed in a generally rectangular shape when viewed in plan view to cover the respective wires 9 and the respective ground connection portions 7 corresponding thereto and are arranged in the rear-end-side terminal portion formation region 14.

The respective semiconductive layers 5 are provided in spaced-apart relation along the oblique direction intersecting the widthwise direction and the longitudinal direction. More specifically, as shown in FIG. 2, the respective semiconductive layers 5 are arranged to be spaced apart from each other by a spacing D1 when projected in the widthwise direction. The first semiconductive layer 5A, the second semiconductive layer 5B, the third semiconductive layer 5C, and the fourth semiconductive layer 5D are arranged successively in a direction from one longitudinal side (front end side, i.e., left-hand side in FIG. 2) to the other longitudinal side (rear end side, i.e., right-hand side in FIG. 2).

The respective semiconductive layers 5 are also arranged to have both widthwise end portions (except for the widthwise outer end portions of the two respective semiconductive layers 5 on both widthwise outsides) superpose (overlap) each other, i.e., such that the end portion of the first semiconductive layer 5A on the other widthwise side overlaps the end portion of the second semiconductive layer 5B on one widthwise side, the end portion of the second semiconductive layer 5B on the other widthwise side overlaps the end portion of the third semiconductive layer 5C on one widthwise side, and the end portion of the third semiconductive layer 5C on the other widthwise side overlaps the end portion of the fourth semiconductive layer 5D on one widthwise side when projected in the longitudinal direction. As the semiconductive layers 5, the first semiconductive layer 5A, the second semiconductive layer 5B, the third semiconductive layer 5C, and the fourth semiconductive layer 5D are arranged successively in the direction from one widthwise side (left-hand side in FIG. 3) to the other widthwise side (right-hand side in FIG. 3).

The spacing D1 between the individual semiconductive layers 5 in a widthwise projection plane is set to a value in the range of, e.g., 10 to 1000 µm, or preferably 50 to 500 µm. The length D2 (widthwise length, hereinafter referred to as such) of the overlapping portion between the individual semiconductive layers 5 is set to a value in the range of, e.g., 10 to 500 µm, or preferably 50 to 300 µm.

In such an arrangement, the individual semiconductive layers 5 overlap each other when projected in the longitudinal direction. Therefore, even when the spacing between the individual wires 9 in the widthwise direction is small, the semiconductive layers 5 can be efficiently arranged by ensuring the space in which the semiconductive layers 5 are formed.

As shown in FIG. 3, the semiconductive layers 5 are formed on the insulating base layer 3 covered with first insulating cover layers 6A (described later) indicated by the imaginary lines to cover the respective wires 9 and the respective ground connection portions 7 corresponding thereto. That is, the respective semiconductive layers 5 are formed to be interposed between the insulating cover layer 6 (the respective first insulating cover layers 6A), the insulating base layer 3, the respective wires 9, and the respective ground connection portions 7.

As a result, the respective semiconductive layers 5 have the lower sides in the thickness direction in contact with the respective wires 9, the respective ground connection portions 7, and the insulating base layer 3 and have the upper sides in the thickness direction in contact with the insulating cover layer 6 (the respective first insulating cover layers 6A).

Each of the semiconductive layers 5 is formed to expose only the one widthwise side surface (left side surface) of the upper part 13 of each of the ground connection portions 7. That is, at each of the ground connection portions 7, each semiconductive layer 5 is formed continuously on the upper surface of the upper part 13 of each ground connection portion 7, on the other widthwise side surface (right side surface) of the upper part 13 of each ground connection portion 7, and on the both longitudinal side surfaces (not shown) of the upper part 13 of each ground connection portion 7.

Each of the semiconductive layers 5 is formed continuously on the upper surface of each wire 9, on the one widthwise side surface (left side surface) of each wire 9, and on the other widthwise side surface (right side surface) of each wire 9.

Each of the semiconductive layers 5 continuously covers each ground connection portion 7, each wire 9, the insulating base layer 3 therebetween, and the insulating base layer 3 on the other widthwise side of the wire 9. As a result, the respective wires 9 are electrically connected to the respective ground connection portions 7 via the respective semiconductive layers 5.

Each of the semiconductive layers 5 is in contact with the upper part 13 of each ground connection portion 7 at the one widthwise outside (left-hand side) of each wire 9 and electrically connected to the metal supporting board 2 via each ground connection portion 7.

As a result, the respective wires 9 are electrically connected to the metal supporting board 2 via the respective semiconductive layers 5 and the respective ground connection portions 7.

The surface resistance value between each of the wires 9 and the metal supporting board 2 is set to a value in the range of, e.g., $1 \times 10^4$ to $1 \times 10^{12}$ $\Omega/\square$, or preferably $1 \times 10^6$ to $1 \times 10^{11}$ $\Omega/\square$, depending on the surface resistance value (described later) of the semiconductive layers 5.

As shown in FIG. 2 and described above, the individual semiconductive layers 5 are provided in spaced-apart relation along the oblique direction intersecting the widthwise direction and the longitudinal direction to be independent of each other in correspondence to the respective wires 9. Consequently, the individual semiconductive layers 5 are electrically insulated from each other in such a manner that the first semiconductive layer 5A and the second semiconductive layer 5B are electrically insulated from each other, the second semiconductive layer 5B and the third semiconductive layer 5C are electrically insulated from each other, and the third semiconductive layer 5C and the fourth semiconductive layer 5D are electrically insulated from each other.

As shown in FIG. 3, in the rear-end-side terminal portion formation region 14, the insulating cover layer 6 is formed on the upper surface of the insulating base layer 3 exposed from each of the semiconductive layers 5 to cover each semiconductive layer 5 and the widthwise one side surface of the upper part 13 of each ground connection portion 7 exposed from each semiconductive layer 5. In the regions (the middle region 15 and a front-end-side terminal portion formation region 14) other than the rear-end-side terminal portion formation region 14, the insulating cover layer 6 is formed continuously on the upper surface of the insulating base layer 3 exposed from the conductive pattern 4 to cover the conductive pattern 4, though not shown.

The insulating cover layer 6 has openings, though not shown, in the portions corresponding to the terminal portions 8 of the conductive pattern 4 to expose the terminal portions 8.

The length and width of the insulating cover layer 6 are selected appropriately to provide the shape described above depending on the purpose and application.

The insulating cover layer 6 is formed of the first insulating cover layers 6A and a second insulating cover layer 6B when the first insulating cover layer 6A is used as an etching resist in the step (see FIG. 5(f)) of producing the suspension board with circuit 1 described later.

Figure 5:
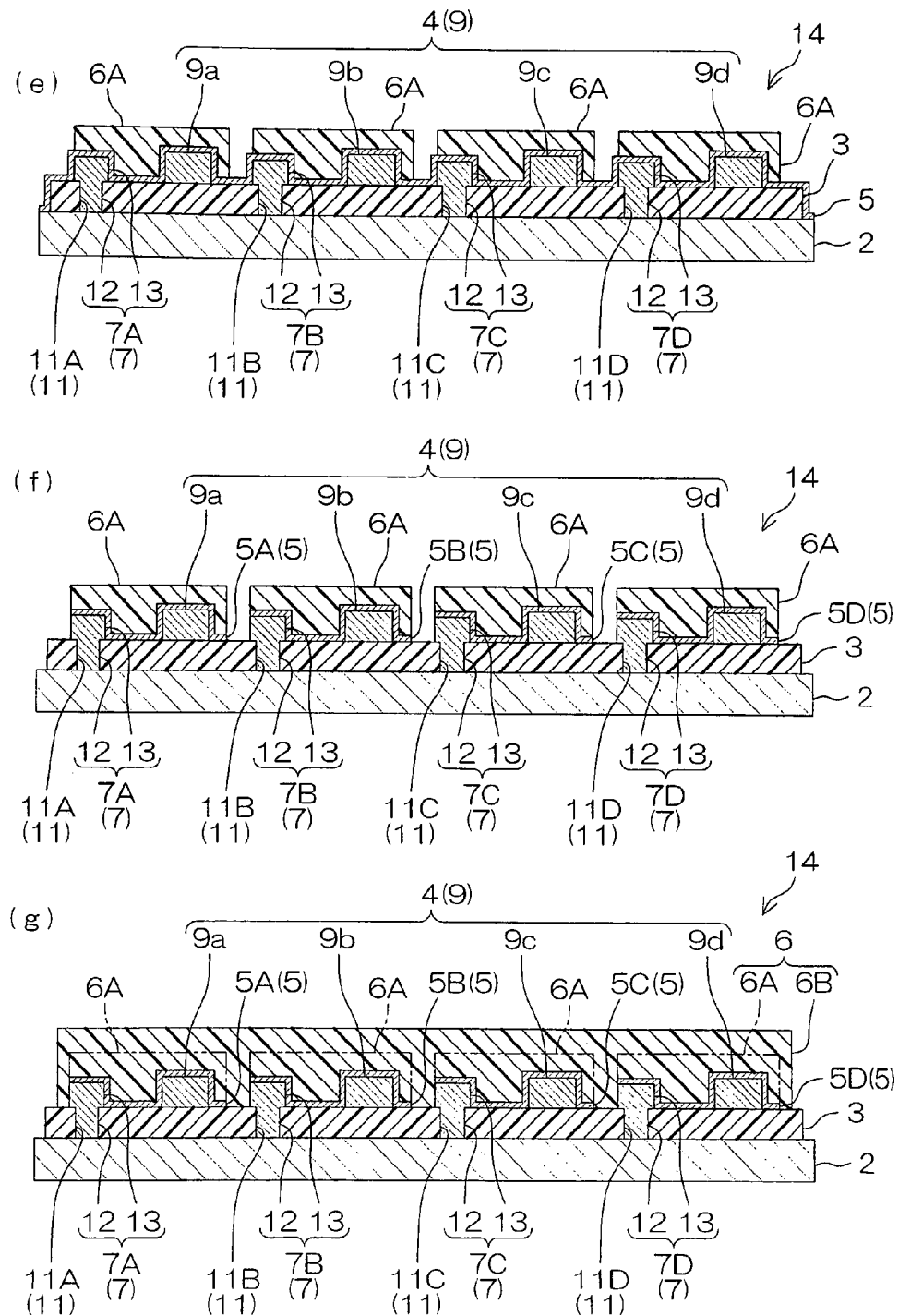
FIG. 5 is a cross-sectional view showing the steps of producing the suspension board with circuit shown in FIG. 3 subsequently to FIG. 4, (e) showing the step of forming first insulating cover layers in patterns independent of each other on the semiconductive layer in the rear-end-side terminal portion formation region, (f) showing the step of removing the semiconductive layer exposed from the first insulating cover layers, and (g) showing the step of forming a second insulating cover layer in a pattern on the first insulating cover layers and the insulating base layer.

FIGS. 4 and 5 are cross-sectional views showing the steps of producing the suspension board with circuit shown in FIG. 3.

Next, a description is given to a method for producing the suspension board with circuit 1 with reference to FIGS. 4 and 5.

First, as shown in FIG. 4(a), the metal supporting board 2 is prepared in the method.

For the metal supporting board 2, a foil of a metal such as, e.g., stainless steel, a 42-alloy, aluminum, copper, a copper-beryllium alloy, or phosphor bronze is used, or preferably a stainless steel foil is used. The thickness of the metal supporting board 2 is in the range of, e.g., 10 to 51 µm, or preferably 15 to 30 µm.

Then, as shown in FIG. 4(b), the insulating base layer 3 is formed on the metal supporting board 2 to correspond to the portion where the conductive pattern 4 is formed and have the plurality of base openings 11.

The insulating base layer 3 is made of a resin such as, e.g., a polyimide resin, a polyamide imide resin, an acrylic resin, a polyether nitrile resin, a polyether sulfone resin, a polyethylene terephthalate resin, a polyethylene naphthalate resin, or a polyvinyl chloride resin. In terms of heat resistance, the insulating base layer 3 is preferably made of the polyimide resin.

The method for forming the insulating base layer 3 in the foregoing pattern is not particularly limited and a known method is used. For example, a varnish of a photosensitive resin (photosensitive polyamic acid resin) is coated on a surface of the metal supporting board 2 and the coated varnish is dried to form a base coating. Then, the base coating is exposed to light via a photomask, heated as necessary, and developed to form the foregoing pattern. Thereafter, the pattern is cured (imidized) by, e.g., heating at a temperature of not less than 250° C. under a reduced pressure.

The thickness of the insulating base layer 3 thus formed is in the range of, e.g., 1 to 35 µm, or preferably 8 to 15 µm.

Next, as shown in FIG. 4(c), the conductive pattern 4 is formed on the insulating base layer 3 as the foregoing wired circuit pattern, while the each of the ground connection portions 7 are formed simultaneously on the metal supporting board 2 exposed from the each of the base openings 11 of the insulating base layer 3 to fill the lower parts 12 in the each of the base openings 11 of the insulating base layer 3 and to have the upper parts 13 covering the peripheries of the each of the base openings 11 in the insulating base layer 3.

The conductive pattern 4 and the ground connection portions 7 are made of a same conductive material such as, e.g., copper, nickel, gold, a solder, or an alloy thereof, or preferably made of copper. The conductive pattern 4 and the ground connection portions 7 are formed in the foregoing pattern on the upper surfaces of the insulating base layer 3 and the metal supporting board 2 (including the portions of the insulating base layer 3 exposed from the each of the base openings 11) by a known patterning method such as, e.g., an additive method or a subtractive method. Preferably, the conductive pattern 4 and the ground connection portions 7 are formed by the additive method.

In the additive method, a conductive thin film (seed film) is formed first on the surfaces of the insulating base layer 3 and the metal supporting board 2. To form the conductive thin film, a chromium thin film and a copper thin film are successively laminated by sputtering, or preferably by chromium sputtering and copper sputtering.

Then, a plating resist is formed in a pattern reverse to the pattern of the conductive pattern 4 and the ground connection portions 7 on the upper surface of the conductive thin film. Then, the conductive pattern 4 and the ground connection portions 7 are simultaneously formed on the upper surface of the conductive thin film exposed from the plating resist by electrolytic plating. Thereafter, the plating resist and the portion of the conductive thin film on which the plating resist is laminated are removed.

The thickness of the conductive pattern 4 thus formed is in the range of, e.g., 3 to 20 µm, or preferably 5 to 20 µm. The thickness of the upper part 13 of the ground connection portion 7 is in the range of 3 to 20 µm, or preferably 5 to 20 µm. The thickness of the lower part 12 of the ground connection portion 7 is the same as the thickness of the insulating base layer 3.

Next, a metal thin film, though not shown, is formed as necessary on the surface of the conductive pattern 4 and on the surface of the ground connection portion 7.

The metal thin film is made of a metal such as, e.g., nickel, gold, tin, chromium, titanium, zirconium, or an alloy thereof, or preferably, made of nickel.

The metal thin film is formed on, e.g., the surface of the conductive pattern 4 and on the surface of the ground connection portion 7 by, e.g., an electrolytic or electroless plating method, a sputtering method using the metal listed above as a target, or the like. Preferably, the metal thin film made of a nickel thin film is formed by electroless nickel plating.

In electroless plating, the metal thin film is formed by, e.g., dipping the suspension board with circuit 1 in a process of the production shown in FIG. 4(c) in a solution of the metal listed above.

The thickness of the metal thin film formed as necessary is in the range of, e.g., 0.01 to 0.5 µm, or preferably 0.05 to 0.3 µm.

Next, as shown in FIG. 4(d), each semiconductive layer 5 is formed continuously on the surface of the conductive pattern 4 (or on the surface of the metal thin film when the conductive pattern 4 is covered with the metal thin film), on the surface of the upper part 13 of the ground connection portion 7 (or the surface of the metal thin film when the upper part 13 of each of the ground connection portions 7 is covered with the metal thin film), on the surface of the insulating base layer 3 exposed from the conductive pattern 4 and the upper part 13 of the ground connection portion 7, and on the surface of the metal supporting board 2 exposed from the insulating base layer 3.

As a semiconductive material forming the semiconductive layer 5, a metal or a resin is used.

For example, a metal oxide or the like is used as the metal. Examples of the metal oxide include chromium oxide, nickel oxide, copper oxide, titanium oxide, zirconium oxide, indium oxide, aluminum oxide, and zinc oxide. Preferably, chromium oxide is used.

The method for forming the semiconductive layer 5 made of a metal oxide is not particularly limited. For example, the method such as a method of oxidizing a metal using a metal as a target after sputtering by heating as necessary, a method of reactive sputtering, or a method of sputtering using a metal oxide as a target is used.

In the method of oxidizing a metal using a metal as a target after sputtering by heating as necessary, the semiconductive layer 5 made of a metal oxide is formed by, e.g., a method of sputtering a metal such as chromium as a target, while introducing an inert gas such as argon, and then oxidizing the metal in an atmosphere at a temperature of 50 to 400° C. for 1 minute to 12 hours using a heating furnace or the like as necessary.

In the method of reactive sputtering, the semiconductive layer 5 made of a metal oxide is formed by, e.g., sputtering a metal such as chromium as a target in a sputtering apparatus, while introducing a reactive gas containing oxygen.

In the method of sputtering a metal oxide as a target, the semiconductive layer 5 made of a metal oxide is formed by, e.g., sputtering a metal oxide such as chromium oxide as a target in a sputtering apparatus, while introducing an inert gas such as argon.

Such a semiconductive layer 5 can be formed in accordance with the description of Japanese Unexamined Patent Publication No. 2004-335700.

As the resin, there can be used, e.g., a semiconductive resin composition or the like in which conductive particles are dispersed.

The semiconductive resin composition contains, e.g., an imide resin or an imide resin precursor, conductive particles, and a solvent.

As the imide resin, a known imide resin can be used. For example, polyimide, polyether imide, polyamide imide, or the like is used.

As the imide resin precursor, there can be used an imide resin precursor described in, e.g., Japanese Unexamined Patent Publication No. 2004-35825. For example, a polyamic acid resin is used.

As the conductive particles, there can be used, e.g., conductive polymer particles, carbon particles, metal particles, metal oxide particles, or the like.

As the conductive polymer particles, there can be used, e.g., particles of polyaniline, polypyrrole, polythiophene, or the like or particles of a derivative thereof. Preferably, particles of polyaniline are used. To the conductive polymer particles, conductivity is imparted by doping with a dopant.

As the dopant, there can be used, e.g., a p-toluenesulfonic acid, a dodecylbenzenesulfonic acid, an alkylnaphthalenesulfonic acid, a polystyrenesulfonic acid, a p-toluenesulfonic acid novolac resin, a p-phenolsulfonic acid novolac resin, a 6-naphthalenesulfonic acid formalin condensate, or the like.

The doping may be performed by either preliminarily mixing the dopant in the solvent in which the conductive polymer particles are dispersed (dissolved) or after forming the semiconductive layer 5 and then dipping the suspension board with circuit 1 formed with the semiconductive layer 5 in a process of the production in the solution of the dopant.

As the carbon particles, there are used, e.g., particles of a carbon black or a carbon nanofiber.

As the metal particles, there are used, e.g., particles of chromium, nickel, copper, titanium, zirconium, indium, aluminum, zinc, or the like.

As the particles of a metal oxide, there are used particles of, e.g., chromium oxide, nickel oxide, copper oxide, titanium oxide, zirconium oxide, indium oxide, aluminum oxide, zinc oxide, or the like, or particles of a composite oxide thereof, more specifically particles of a composite oxide of indium oxide and tin oxide (ITO particles), particles of a composite oxide of tin oxide and phosphorus oxide (PTO particles), or the like.

The conductive particles can be used alone or in a combination of two or more thereof. Preferably, the ITO particles are used.

The conductive particles have an average particle diameter in the range of, e.g., 10 nm to 1 µm, preferably 10 nm to 400 nm, or more preferably 10 nm to 100 nm. When the conductive particles are made of a carbon nanofiber, the diameters thereof are in the range of, e.g., 100 to 200 nm and the lengths thereof are in the range of, e.g., 5 to 20 µm. When the average particle diameter is under the range shown above, the adjustment of the average particle diameter may be difficult. When the average particle diameter is over the range shown above, it may result in unsuitableness for coating.

The solvent is not particularly limited as long as the imide resin or the imide resin precursor and the conductive particles can be dispersed (dissolved) therein. For example, an aprotic polar solvent such as N-methyl-2-pyrrolidone (NMP), N,N-dimethylacetoamide, N,N-dimethylformamide, or dimethylsulfoxide is used. The solvents may be used alone or in a combination of two or more thereof.

The semiconductive resin composition can be prepared by mixing the imide resin or the imide resin precursor, the conductive particles, and the solvent, each described above.

The mixing ratio of the conductive particles is, e.g., 1 to 300 parts by weight, or preferably 5 to 100 parts by weight of the conductive particles to 100 parts by weight of the imide resin or the imide resin precursor. When the mixing ratio of the conductive particles is lower than the range shown above, the conductivity may be insufficient. When the mixing ratio of the conductive particles is higher than the range shown above, the excellent film properties of the imide resin or the imide resin precursor may be impaired.

The solvent is mixed such that the ratio of the total amount of the imide resin or the imide resin precursor and the conductive particles to the amount of the semiconductive resin composition is, e.g., 1 to 40 wt % (in solids concentration), or preferably 5 to 30 wt % (in solids concentration). When the solids concentration is either higher or lower than the range shown above, it may be difficult to adjust to a target film thickness.

The semiconductive resin composition prepared above is uniformly coated on the surface of the conductive pattern 4, on the surface of the upper part 13 of each ground connection portion 7, on the surface of the insulating base layer 3 exposed from the conductive pattern 4 and the upper part 13 of each ground connection portion 7, and on the surface of the metal supporting board 2 exposed from the insulating base layer 3 by a known coating method such as a roll coating method, a gravure coating method, a spin coating method, or a bar coating method. Thereafter, the coating is dried by heating at a temperature of, e.g., 60 to 250° C., or preferably 80 to 200° C. for, e.g., 1 to 30 minutes, or preferably 3 to 15 minutes.

When the semiconductive resin composition contains the imide resin precursor after drying, the imide resin precursor is cured (imidized) by, e.g., heating at a temperature of not less than 250° C. under a reduced pressure.

In this manner, the semiconductive layer 5 can be formed continuously on the surface of the conductive pattern 4, on the surface of the upper part 13 of each ground connection portion 7, on the surface of the insulating base layer 3 exposed from the conductive pattern 4 and the upper part 13 of each ground connection portion 7, and on the surface of the metal supporting board 2 exposed from the insulating base layer 3.

The thickness of the semiconductive layer 5 thus formed is in the range of, e.g., not more than 40 μm, or preferably 3 to 20 nm.

The surface resistance value of the semiconductive layer 5 is set to a value in the range of, e.g., $10^5$ to $10^{13}$ Ω/□, preferably $10^5$ to $10^{11}$ Ω/□, or more preferably $10^6$ to $10^9$ Ω/□. When the surface resistance value of the semiconductive layer 5 is under the foregoing range, there may be a case to cause malfunction of the magnetic head mounted thereon. When the surface resistance value of the semiconductive layer 5 is over the foregoing range, there may be a case to fall in preventing electrostatic breakdown.

Then, as shown in FIG. 5(e), the first insulating cover layers 6A are formed in patterns independent of each other in correspondence to the plan shape of each of the semiconductive layers 5 described above on the semiconductive layer 5 in the rear-end-side terminal portion formation region 14 to be located at the same position as the semiconductive layer 5.

The first insulating first cover layers 6A are made of the same resin as used to form the insulating base layer 3, preferably a photosensitive synthetic resin, or more preferably photosensitive polyimide.

The method for forming the first insulating cover layers 6A in the foregoing pattern is not particularly limited and a known method is used. For example, a varnish of a photosensitive resin (photosensitive polyamic acid resin) is coated on the surface of the semiconductive layer 5 and the coated varnish is dried to form a first cover coating. Then, the first cover coating is exposed to light via a photomask, heated as necessary, and developed to form the foregoing pattern. Thereafter, the pattern is cured (imidized) by, e.g., heating at a temperature of not less than 250° C. under a reduced pressure.

The thickness of the first insulating cover layers 6A thus formed is in the range of, e.g., 2 to 10 μm, or preferably 3 to 5 μm.

Then, as shown in FIG. 5(f), the semiconductive layers 5 exposed from the first insulating cover layers 6A are removed by etching.

As the etching, wet etching is performed using an aqueous alkaline solution such as an aqueous potassium hydroxide solution as an etchant and using the first insulating cover layers 6A as an etching resist by a dipping method or a spraying method.

In this manner, the plurality of semiconductive layers 5 can be formed in the patterns independent of each other at the same positions as the first insulating cover layers 6A when viewed in plan view.

Then, as shown in FIG. 5(g), the second insulating cover layer 6B is formed on the insulating base layer 3 to cover the first insulating cover layers 6A in the rear-end-side terminal portion formation region 14 and cover the conductive pattern 4 in the regions (the middle region 15 and the front-end-side terminal portion formation region 14) other than the rear-end-side terminal portion formation region 14, thereby forming the insulating cover layer 6 in the foregoing pattern.

The second insulating first cover layer 6B is made of the same resin as used to form the first cover layers 6A, preferably a photosensitive synthetic resin, or more preferably photosensitive polyimide.

The method for forming the second insulating cover layer 6B in the foregoing pattern is not particularly limited and a known method is used. For example, a varnish of a photosensitive resin (photosensitive polyamic acid resin) is coated on the upper surface and the side surface of the first insulating cover layers 6A, on the one widthwise side surface of each of the ground connection portions 7, on the upper surface of the insulating base layer 3, and on the upper surface of the metal supporting board 2 and the coated varnish is dried to form a second cover coating. Then, the second cover coating is exposed to light via a photomask, heated as necessary, and developed to form the foregoing pattern (in which openings are formed to correspond to the magnetic-head-side connection terminal portions 8A and the external connection terminal portions 8B are opened). Thereafter, the pattern is cured (imidized) by, e.g., heating at a temperature of not less than 250° C. under a reduced pressure.

The thickness of the second insulating cover layer 6B thus formed is in the range of, e.g., 1 to 40 μm, or preferably 1 to 7 μm.

The total thickness of each of the first insulating cover layers 6A and the second insulating cover layer 6B at the portion of the rear-end-side terminal portion formation region 14 where the second insulating cover layer 6B is laminated on the first insulating cover layer 6A is in the range of, e.g., 3 to 20 μm, or preferably 5 to 15 μm.

By thus forming the second insulating cover layer 6B in the foregoing pattern on the insulating base layer 3, the insulating cover layer 6 including the first insulating cover layers 6A and the second insulating cover layer 6B is formed.

Thereafter, the metal supporting board 2 is cut out by chemical etching to form the gimbal 10 and then trimmed as shown in FIG. 1, whereby the suspension board with circuit 1 is obtained.

The suspension board with circuit 1 includes the plurality of semiconductive layers 5 electrically connected to the metal supporting board 2 and to the respective wires 9. Consequently, the conductive pattern 4 is electrically connected to the metal supporting board 2 via the plurality of semiconductive layers 5. This allows efficient removal of the electrostatic charging of the conductive pattern 4.

Figure 11:
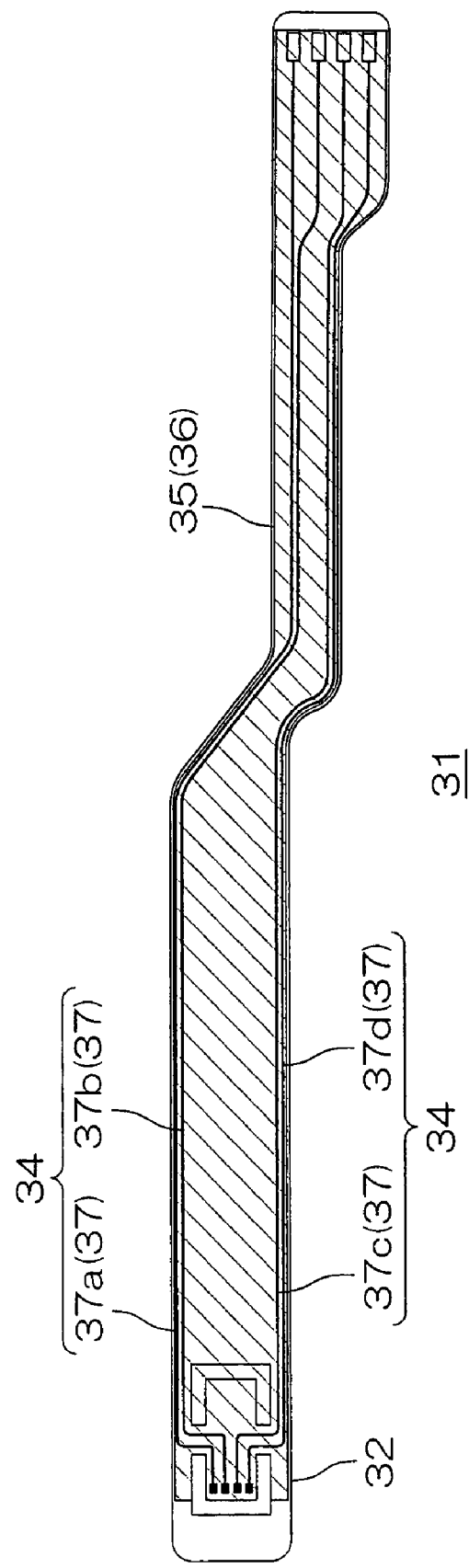
FIG. 11 is a schematic plan view showing a suspension board with circuit (in which a semiconductive layer is formed continuously on terminal portion formation regions and a middle region)
Figure 12:
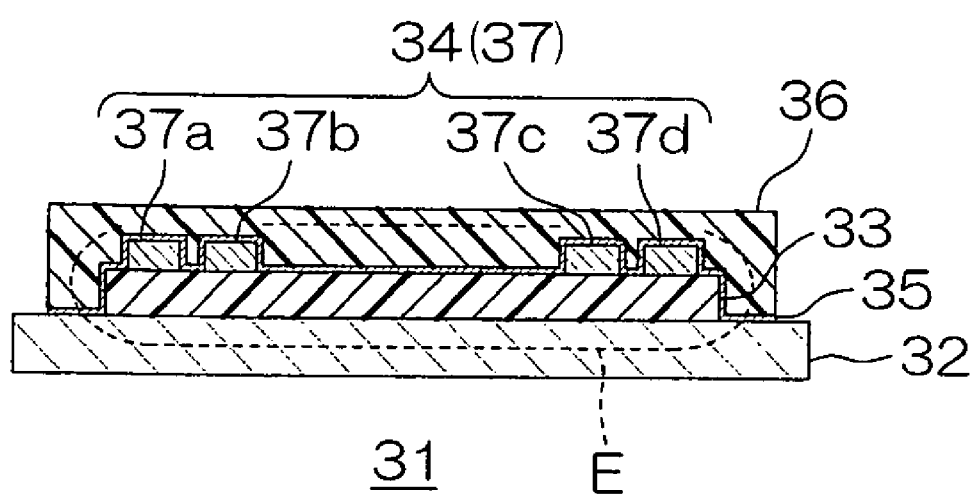
FIG. 12 is a cross-sectional view in a widthwise direction of the suspension board with circuit shown in FIG. 11.

In addition, the semiconductive layers 5 are not provided continuously over the individual wires 37 as in the suspension board with circuit 31 shown in FIGS. 11 and 12, but are provided independently of each of other in correspondence to the respective wires 9. This allows reliable prevention of the short circuit of the conductive pattern 4 without causing a short circuit between the individual wires 9.

When the semiconductive layer 35 is formed widthwise continuously over each of the wires 37, the insulating base layer 33, and the metal supporting board 32 exposed from the both widthwise side surfaces of the insulating base layer 33 as shown in, e.g., FIG. 12, there may be a case where a loop-like electric field E indicated by the dotted line along the widthwise direction is formed around each of the one pair wires 37a and 37b and the other pair of wires 37c and 37d due to the potential differences produced between the one pair of wires 37a and 37b and between the other pair of wires 37c and 37d. When such a loop-like electric field E is formed, there may be a case where the metal of the metal supporting board 32 migrates (ion migration) to the insulating cover layer 36.

However, in the suspension board with circuit 1 shown in FIG. 3, the individual semiconductive layers 5 are provided independently of each other in correspondence to the respective wires 9, as described above. Consequently, the individual semiconductive layers 5 are electrically insulated from each other. Therefore, even when the one pair of wires 9a and 9b has a potential difference produced therebetween and the other pair of wires 9c and 9d has a potential difference produced therebetween, the formation of an electric field around the one pair of wires 9a and 9b and the formation of an electric field around the other pair of wires 9c and 9d, i.e., the formation of the loop-like electric field E as indicated by the dotted line in FIG. 12, can be reliably prevented.

Therefore, this allows reliable prevention of the ion migration from the metal supporting board 2 to the insulating cover layer 6.

As a result, it is possible to reliably prevent the electrostatic breakdown of the mounted magnetic head and also reliably improve the connection reliability of the suspension board with circuit 1.

Figure 7:
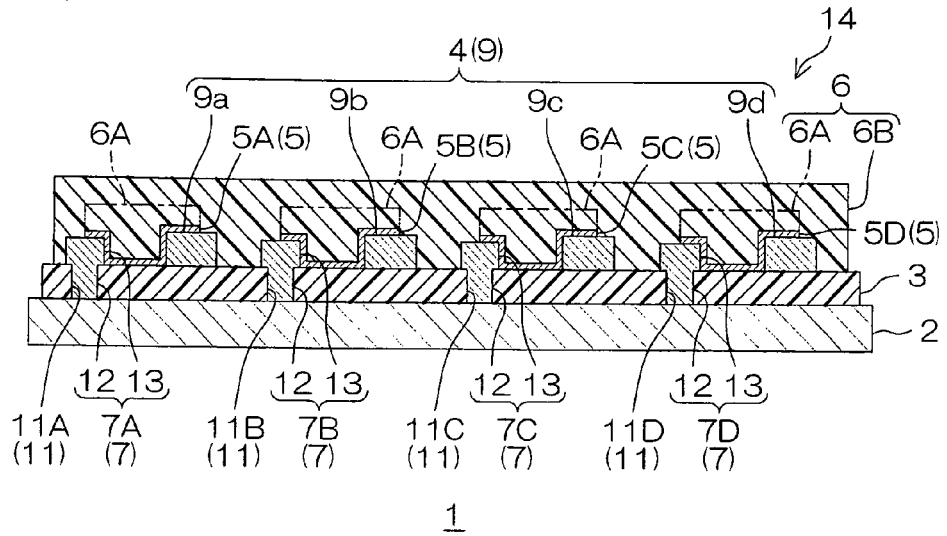
FIG. 7 is a cross-sectional view of a suspension board with circuit as a wired circuit board according to another embodiment of the present invention, which corresponds to FIG. 3.

In the description given above, each of the semiconductive layers 5 is formed continuously in the widthwise direction from the upper surface of the upper part 13 of each ground connection portion 7 to the surface (upper surface and side surface) of each wire 9, as shown in FIG. 3. However, the range covered by the semiconductive layer 5 is not limited thereto as long as the semiconductive layer 5 is connected to each wire 9 and each ground connection portion 7. For example, each of the semiconductive layers 5 may also be formed continuously from a widthwise midway on the upper surface of the upper part 13 of each ground connection portion 7 to a widthwise midpoint on the upper surface of each wire 9, as shown in FIG. 7.

In the description given above, the semiconductive layers 5 are formed in the rear-end-side terminal portion formation region 14, as shown in FIG. 1. However, the region where the semiconductive layers 5 are formed is not limited thereto. Instead, the semiconductive layers 5 may also be formed in the middle region 15 and the front-end-side terminal portion formation region 14.

In the description given above, each of the ground connection portions 7 is formed only on one widthwise side (left-hand side in FIG. 3) of each wire 9. However, it is also possible to, e.g., form each ground connection portion 7 only on the other widthwise side (right-hand side) of each wire 9 and form each semiconductive layer 5 on the surface thereof, as indicated by the imaginary lines of FIG. 3.

In the method for producing the suspension board with circuit 1 described above, the first insulating cover layers 6A are formed and the semiconductive layers 5 are formed using the first insulating cover layers 6A as the etching resist. However, it is also possible to form the semiconductive layers 5 using a known etching resist 17 as a resist without forming the first insulating cover layers 6A.

Figure 6:
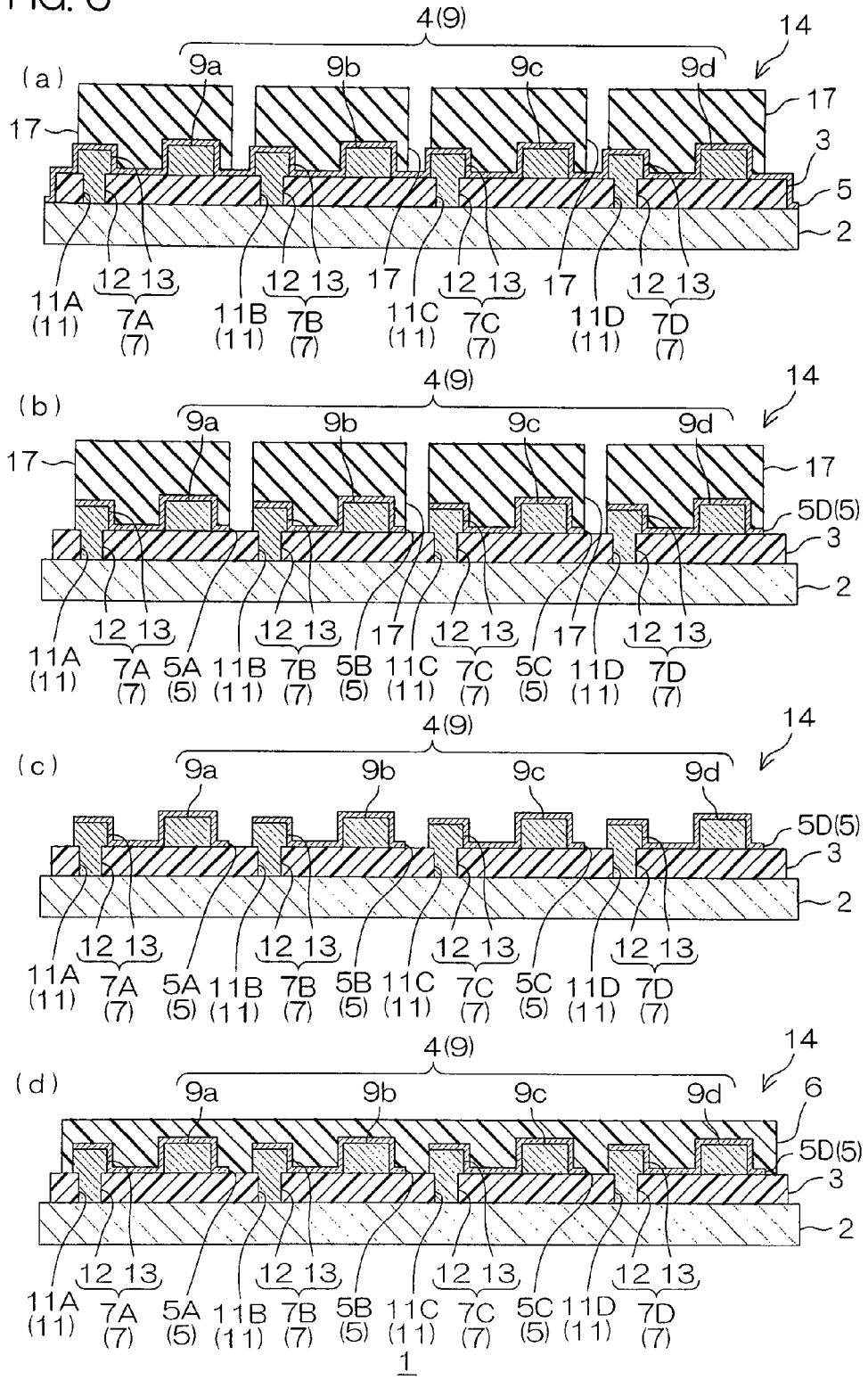
FIG. 6 is a cross-sectional view showing other steps of producing the suspension board with circuit shown in FIGS. 4 and 5, (a) showing the step of forming etching resists in patterns independent of each other on the semiconductive layer in the rear-end-side terminal portion formation region, (b) showing the step of removing the semiconductive layer exposed from the etching resists, (c) showing the step of removing the etching resists, and (d) showing the step of forming an insulating cover layer in a pattern on the semiconductive layers and the insulating base layer.

FIG. 6 is a cross-sectional view showing other steps as parts of the steps of producing the suspension board with circuit shown in FIGS. 4 and 5.

In this method, as shown in FIG. 4(d), the semiconductive layer 5 is formed continuously on each surface of the conductive pattern 4, the ground connection portion 7, the insulating base layer 3, and the metal supporting board 2. Then, the etching resist 17 is formed on the semiconductive layer 5 in the patterns independent of each other in correspondence to the foregoing plan shape of each of the semiconductive layers 5 in the rear-end-side terminal portion formation region 14 to be located at the same position as the semiconductive layer 5, as shown in FIG. 6(a).

The etching resist 17 is formed in the foregoing patterns by a known method using, e.g., a dry film resist or the like.

Next, as shown in FIG. 6(b), the semiconductive layer 5 exposed from the etching resist 17 is removed by etching (wet etching).

Next, as shown in FIG. 6(c), the etching resist 17 is removed by, e.g., a known etching method such as wet etching or stripping.

Next, as shown in FIG. 6(d), the insulating cover layer 6 is formed in the foregoing pattern in the same manner as described above.

For example, a varnish of a photosensitive resin (photosensitive polyamic acid resin) is coated on the upper surface and the side surface of each of the semiconductive layers 5, on the one widthwise side surface of each of the ground connection portions 7, on the upper surface of the insulating base layer 3, and on the upper surface of the metal supporting board 2 and the coated varnish is dried to form a cover coating. Then, the cover coating is exposed to light via a photomask, heated as necessary, and developed to form the foregoing pattern. Thereafter, the pattern is cured (imidized) by, e.g., heating at a temperature of not less than 250° C. under a reduced pressure.

The thickness of the insulating cover layer 6 thus formed is in the range of, e.g., 1 to 40 μm, or preferably 1 to 7 μm.

In this manner, the suspension board with circuit 1 can also be obtained by forming the semiconductive layers 5 using the known etching resist 17 as a resist without forming the first insulating cover layers 6A.

In accordance with the method, the insulating cover layer 6 having a uniform thickness can be formed without causing a difference between the total thickness of the first insulating cover layers 6A and the second insulating cover layer 6B at the foregoing portion of the rear-end-side terminal portion formation region 14 where the second insulating cover layer 6B is laminated on the first insulating cover layer 6A, and the thickness of the second insulating cover layer 6B. Consequently, the suspension board with circuit 1 having a reduced thickness can be obtained.

In the description given above, the semiconductive layers 5 of the suspension board with circuit 1 are electrically connected to the metal supporting board 2 via the ground connection portions 7 without contacting the semiconductive layers 5 with the metal supporting board 2. However, it is also possible to, e.g., directly contact the semiconductive layers 5 of the suspension board with circuit 1 with the metal supporting board 2, as shown in FIG. 8.

Figure 8:
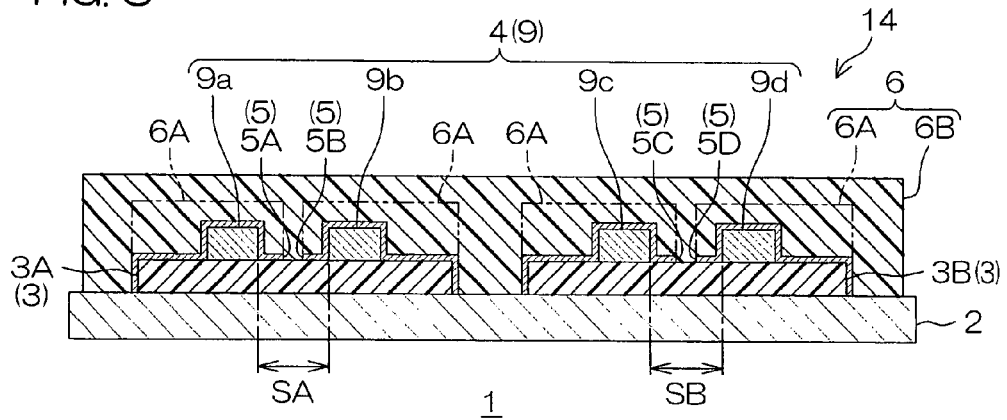
FIG. 8 is a cross-sectional view of a suspension board with circuit as a wired circuit board according to still another embodiment (in which semiconductive layers interposed between respective wires and an insulating cover layer are in direct contact with a metal supporting board) of the present invention, which corresponds to FIG. 3.
Figure 9:
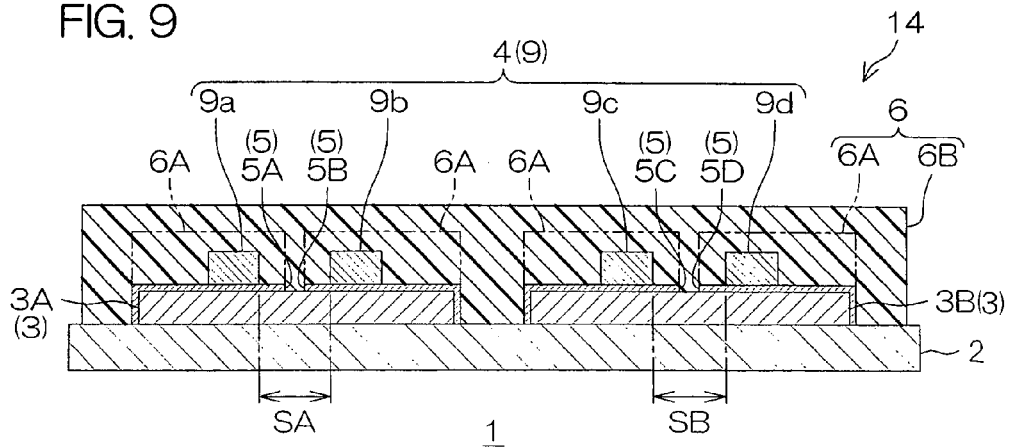
FIG. 9 is a cross-sectional view of a suspension board with circuit as a wired circuit board according to yet another embodiment (in which semiconductive layers interposed between respective wires and an insulating base layer are in direct contact with a metal supporting board) of the present invention, which corresponds to FIG. 3.
Figure 10:
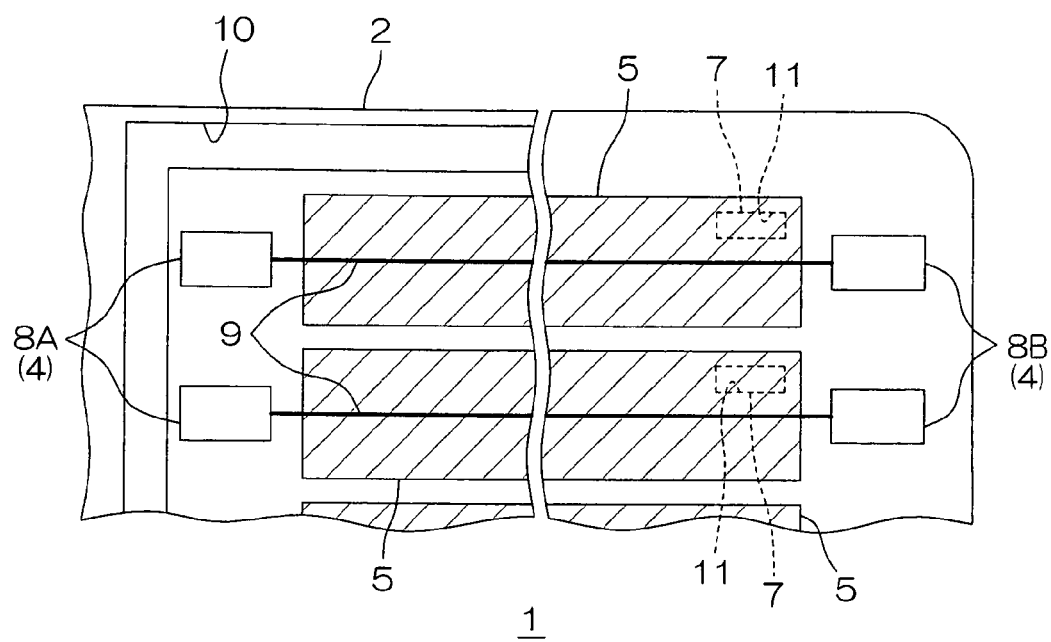
FIG. 10 is an enlarged plan view of a suspension board with circuit as a wired circuit board according to still another embodiment (in which semiconductive layers are each formed in the shape of a flat belt extending in a longitudinal direction and arranged in parallel in a widthwise direction) of the present invention in a front-end-side terminal portion formation region and a rear-end-side terminal portion formation region.

FIGS. 8 and 9 are cross-sectional views of suspension boards with circuits as wired circuit boards according to other embodiments of the present invention, which correspond to FIG. 3. FIG. 8 shows the embodiment in which semiconductive layers interposed between respective wires and an insulating cover layer are in direct contact with a metal supporting board. FIG. 9 shows the embodiment in which semiconductive layers interposed between respective wires and an insulating base layer are in direct contact with a metal supporting board. In the subsequent drawings, the description of the same members as described above is omitted using the same reference numerals.

In FIG. 8, the insulating layer 3 includes a first insulating base layer 3A and a second insulating base layer 3B extending along the longitudinal direction and arranged in widthwise mutually spaced-apart and opposed relation. The first insulating base layer 3A is provided on one widthwise side to correspond to the one pair of wires 9a and 9b. The second insulating base layer 3B is provided on the other widthwise side to correspond to the other pair of wires 9c and 9d. Each of the first insulating base layer 3A and the second insulating base layer 3B is hereinafter simply described as the insulating base layer 3 when distinction therebetween is not particularly needed.

In the same manner as described above, the first semiconductive layer 5A is formed on the upper surface and the side surface of the outer wire 9a on one widthwise side, and on the upper surface of the first insulating base layer 3A, and continuously on the one widthwise side surface of the first insulating base layer 3A to have the lower end surface thereof in direct contact with the upper surface of the metal supporting board 2 exposed from the one widthwise side surface of the first insulating base layer 3A. As a result, the first semiconductive layer 5A is electrically connected to the metal supporting board 2 at one widthwise outside (left-hand side) of a region SA where the one pair of wires 9a and 9b are widthwise opposed.

In the same manner as described above, the second semiconductive layer 5B is formed on the upper surface and the side surface of the inner wire 9b on one widthwise side, and on the upper surface of the first insulating base layer 3A, and continuously on the other widthwise side surface of the first insulating base layer 3A to have the lower end surface thereof in direct contact with the upper surface of the metal supporting board 2 exposed from the other widthwise side surface of the first insulating base layer 3A. As a result, the second semiconductive layer 5B is electrically connected to the metal supporting board 2 at the other widthwise outside (right-hand side) of the region SA where the one pair of wires 9a and 9b are widthwise opposed.

The first semiconductive layer 5A and the second semiconductive layer 5B are arranged in widthwise spaced-apart relation in the region SA where the one pair of wires 9a and 9b are widthwise opposed.

In the same manner as described above, the third semiconductive layer 5C is formed on the upper surface and the side surface of the inner wire 9c on the other widthwise side, and on the upper surface of the second insulating base layer 3B, and continuously on the one widthwise side surface of the second insulating base layer 3B to have the lower end surface thereof in direct contact with the upper surface of the metal supporting board 2 exposed from the one widthwise side surface of the second insulating base layer 3B. As a result, the third semiconductive layer 5C is electrically connected to the metal supporting board 2 at one widthwise outside (left-hand side) of a region SB where the other pair of wires 9c and 9d are widthwise opposed.

In the same manner as described above, the fourth semiconductive layer 5D is formed on the upper surface and the side surface of the outer wire 9d on the other widthwise side, and on the upper surface of the second insulating base layer 3B, and continuously on the other widthwise side surface of the second insulating base layer 3B to have the lower end surface thereof in direct contact with the upper surface of the metal supporting board 2 exposed from the other widthwise side surface of the second insulating base layer 3B. As a result, the fourth semiconductive layer 5D is electrically connected to the metal supporting board 2 at the other widthwise outside (right-hand side) of the region SB where the other pair of wires 9c and 9d are widthwise opposed.

The third semiconductive layer 5C and the fourth semiconductive layer 5D are arranged in widthwise spaced-apart relation in the region SB where the other pair of wires 9c and 9d are widthwise opposed.

The suspension board with circuit 1 is obtained in accordance with, e.g., the following method, though not shown. First, the metal supporting board 2 is prepared. Then, the insulating base layer 3 is formed in the foregoing pattern on the metal supporting board 2 to correspond to the portion where the conductive pattern 4 is formed. Next, the conductive pattern 4 is formed in the foregoing wired circuit pattern on the insulating base layer 3. Next, the semiconductive layer 5 is formed continuously on the respective surfaces of the conductive pattern 4, the insulating base layer 3, and the metal supporting board 2. Next, the first insulating cover layers 6A are formed in patterns independent of each other in correspondence to the foregoing plan shape of the semiconductive layer 5 in the rear-end-side terminal portion formation region 14 to be located at the same position as the semiconductive layer 5.

Next, the semiconductive layer 5 exposed from the first insulating cover layers 6A is removed by etching. The etching is performed to leave the semiconductive layers 5 formed on the side surfaces (both widthwise side surfaces) of the insulating base layer 3.

Next, the second insulating cover layer 6B is formed on the insulating base layer 3 to cover the first insulating cover layers 6A in the rear-end-side terminal portion formation region 14, and cover the conductive pattern 4 in the regions (the middle region 15 and the front-end-side terminal portion formation region 14) other than the rear-end-side terminal portion formation region 14, thereby forming the insulating cover layer 6 in the foregoing pattern.

In accordance with the method, it is unnecessary to provide the ground connection portions 7 together with the formation of the conductive pattern 4. This allows simple and easy production of the suspension board with circuit 1.

In the suspension board with circuit 1 shown in FIG. 3, the respective ground connection portions 7 are formed so that the respective wires 9 are electrically connected to the metal supporting board 2 via the respective ground connection portions 7.

That is, in the suspension board with circuit 1 shown in FIG. 3, the respective semiconductive layers 5 does not contact directly with the metal supporting board 2. This allows more reliable prevention of ion migration from the metal supporting board 2 to the insulating cover layer 6.

In the description given above, the each of the semiconductive layers 5 are interposed between the respective wires 9 and the insulating cover layer 6, as shown in FIG. 8. However, it is also possible to interpose the each of the semiconductive layers 5 between the respective wires 9 and the insulating base layer 3 as shown in, e.g., FIG. 9.

In FIG. 9, the respective semiconductive layers 5 are formed to be interposed between the insulating base layer 3 and the respective wires 9 in the rear-end-side terminal portion formation region 14.

The suspension board with circuit 1 is obtained in accordance with, e.g., the following method, though not shown. First, the metal supporting board 2 is prepared. Then, the insulating base layer 3 is formed in a pattern on the metal supporting board 2 to correspond to the portion where the conductive pattern 4 is formed. Next, the semiconductive layer 5 is formed continuously on the respective surfaces of the insulating base layer 3 and the metal supporting board 2. Next, the conductive pattern 4 is formed in the foregoing wired circuit pattern on the semiconductive layers 5. Next, the first insulating cover layers 6A are formed in patterns independent of each other in correspondence to the foregoing plan shape of each of the semiconductive layers 5 in the rear-end-side terminal portion formation region 14 to be located at the same position as the semiconductive layer 5.

Next, the semiconductive layer 5 exposed from the first insulating cover layers 6A is removed by etching. The etching is performed to leave the semiconductive layers 5 formed on the side surfaces (both widthwise side surfaces) of the insulating base layer 3.

Next, the second insulating cover layer 6B is formed on the insulating base layer 3 to cover the first insulating cover layers 6A in the rear-end-side terminal portion formation region 14, and cover the conductive pattern 4 in the regions (the middle region 15 and the front-end-side terminal portion formation region 14) other than the rear-end-side terminal portion formation region 14, thereby forming the insulating cover layer 6 in the foregoing pattern.

The suspension board with circuit 1 is also obtained in accordance with, e.g., the following method other than the foregoing method, though not shown. First, the metal supporting board 2 is prepared. Then, the insulating base layer 3 is formed in a pattern on the metal supporting board 2 to correspond to the portion where the conductive pattern 4 is formed. Next, a conductive thin film (seed film) is formed on the respective surfaces of the insulating base layer 3 and the metal supporting board 2 by successively laminating a chromium thin film and a copper thin film by chromium sputtering and copper sputtering. Thereafter, the conductive pattern 4 is formed in the foregoing wired circuit pattern on the conductive thin film by an additive method. Then, the copper thin film exposed from the conductive pattern 4 is removed by etching such that the chromium thin film remains. Next, the chromium thin film exposed as a result of removing the copper thin film is subjected to a semi-conductivity imparting process involving oxidation based on heating, thereby forming the semiconductive layer 5 made of a chromium oxide layer. Next, the first insulating cover layers 6A are formed in a pattern to be located at the same position as the semiconductive layer 5 described above when viewed in plan view in the rear-end-side terminal portion formation region 14.

Next, the semiconductive layer 5 exposed from the first insulating cover layers 6A is removed by etching. The etching is performed to leave the semiconductive layers 5 formed on the side surfaces (both widthwise side surfaces) of the insulating base layer 3.

Next, the second insulating cover layer 6B is formed on the insulating base layer 3 to cover the first insulating cover layers 6A in the rear-end-side terminal portion formation region 14, and cover the conductive pattern 4 in the regions (the middle region 15 and the front-end-side terminal portion formation region 14) other than the rear-end-side terminal portion formation region 14, thereby forming the insulating cover layer 6 in the foregoing pattern.

In accordance with such a method, it is possible to easily and efficiently produce the foregoing suspension board with circuit 1 shown in FIG. 9.

In the description given above, the respective semiconductive layers 5 are formed in the rear-end-side terminal portion formation region 14, as shown in FIG. 1. However, it is also possible to form each of the semiconductive layer 5 in the shape of a flat belt extending long from the rear-end-side terminal portion formation region 14 to the front-end-side terminal portion formation region 14 along the entire length of each of the wires 9 and to arrange the semiconductive layers 5 in parallel and widthwise spaced-apart relation.

By forming each of the semiconductive layers 5 in the shape described above, it is possible to ensure the much wider contact areas between the respective semiconductive layers 5 and the respective wires 9 and more efficiently remove the electrostatic charging of the conductive pattern 4.

In the description given above, each of the ground connection portions 7 is formed in a generally rectangular shape when viewed in plan view. However, the shape of the ground connection portion 7 is not limited thereto. For example, the ground connection portion 7 can be formed in an appropriate shape such as a generally circular shape when viewed in plan view.

In the description given above, each of the semiconductive layers 5 is formed in a generally rectangular shape when viewed in plan view. However, the shape of the semiconductive layer 5 is not limited thereto. The semiconductive layers 5 can be formed in appropriate shapes depending on the purpose and application and on the design of a product as long as they are provided independently of each other.

In the description given above, the conductive pattern 4 is formed of the four wires 9. However, the number of the wires 9 is not particularly limited. For example, the conductive pattern 4 can also be formed of six wires 9. The six wires are formed of, e.g., the four wires 9 described above, a TFC (thermal fly-height control) wire to which a signal for controlling the minute gap between the magnetic head and the magnetic disk, and two wires (a pair of wires) composed of ground wires for the TFC wires.

In the description given above, the suspension board with circuit 1 is shown as an example of the wired circuit board according to the present invention. However, the wired circuit board according to the present invention is not limited thereto. The wired circuit board according to the present invention is widely applicable to other wired circuit board such as various flexible wired circuit boards in each of which a metal supporting board 2 is provided as a reinforcing layer.

EXAMPLES

The present invention is described more specifically by showing the example and the comparative example herein below. However, the present invention is by no means limited to the example and the comparative example.

Example 1

A metal supporting board made of a stainless steel foil having a thickness of 20 μm was prepared (see FIG. 4(a)).

Then, a varnish of a photosensitive polyamic acid resin was uniformly coated on a surface of the metal supporting board with a spin coater. Subsequently, the coated varnish was heated at 90° C. for 15 minutes to form a base coating. Thereafter, the base coating was exposed to light at 700 mJ/cm$^2$ via a photomask, heated at 190° C. for 10 minutes, developed with an alkaline developer, and cured at 385° C. under a reduced pressure of 1.33 Pa, thereby forming an insulating base layer made of polyimide on the metal supporting board to form a pattern to correspond to the portion where a conductive pattern was formed and have a plurality of base openings formed to correspond to respective wires subsequently formed in the rear-end-side terminal portion formation region of the metal supporting board formed by trimming described later (see FIG. 4(b)). The thickness of the insulating base layer was 10 μm. Each of the base openings had a rectangular shape when viewed in plan view, a width of 80 μm, and a length of 300 μm.

Then, a conductive pattern made of a copper foil and having a thickness of 10 μm was formed in a wired circuit pattern by an additive method on the upper surface of the insulating base layer. At the same time, a plurality of ground connection portions made of copper were formed on the metal supporting board exposed from the base openings to fill the lower parts in the base openings of the insulating base layer and to have the upper parts covering the peripheries of the base openings of the insulating base layer (see FIG. 4(c)).

The spacing between the wires in the terminal portion formation region was 100 μm. Each of the ground connection portions had the upper part and the lower part each shaped in a rectangle when viewed in plan view. The lower part had a width of 80 μm and a length of 300 μm. The upper part had a width of 140 μm, a length of 360 μm, and a thickness of 10 μm.

Thereafter, a metal thin film composed of a nickel thin film having a thickness of 0.15 μm was formed on the surface of the conductive pattern and on the surfaces of the ground connection portions by electroless nickel plating.

Then, a sputtering coating composed of a chromium thin film was formed on the respective surfaces of the metal thin film formed on the surfaces of the conductive pattern and the ground connection portions, the insulating base layer, and the metal supporting board by sputtering chromium as a target.

The sputtering was performed under the following conditions by a method in accordance with the description of Japanese Unexamined Patent Publication No. 2004-335700.

Target: Cr
Ultimate Degree of Vacuum: $1.33 \times 10^{-3}$ Pa
Flow Rate of Introduced Gas (Ar): $2.0 \times 10^{-3}$ m$^3$/hour
Operating Pressure: 0.16 Pa
Temperature of Earth Electrode: 20° C.
Electric Power: DC 500 W
Sputtering Time: 3 Seconds
Thickness of Sputtering Coating: 100 nm Then, the surface of the sputtering coating composed of the chromium thin film was oxidized by heating in an atmosphere at 125° C. for 12 hours to form a semiconductive layer composed of a chromium oxide layer (see FIG. 4(d)). The thickness of the chromium oxide layer was 100 nm.

The formation of the semiconductive layer composed of the chromium oxide layer was confirmed by ESCA. As a result of measuring the surface resistance value of the semiconductive layer at a temperature of 25° C. and a humidity of 15% using a surface resistance measuring device (Hiresta-up MCP-HT450 available from Mitsubishi Chemical Corporation), it was $1 \times 10^7$ Ω/□.

Then, the varnish of the photosensitive polyamic acid resin mentioned above was uniformly coated on the surface of the semiconductive layer with a spin coater and heated at 90° C. for 10 minutes to form a first cover coating having a thickness of 4.0 μm. Then, the first cover coating was exposed to light at 700 mJ/cm$^2$ via a photomask, heated at 180° C. for 10 minutes, and developed with an alkaline developer to be patterned. Thereafter, the patterned first cover coating was cured at 385° C. under a reduced pressure of 1.33 Pa. In this manner, first insulating cover layers made of the polyimide were formed in the foregoing patterns independent of each other on the semiconductive layer formed in the rear end-side terminal portion formation region (see FIG. 5(e)). Each of the first insulating cover layers had a rectangular shape when viewed in plan view, a width of 200 μm, a length of 200 μm, and a thickness of 4.0 μm.

Subsequently, the semiconductive layer exposed from the first insulating cover layers was removed by wet etching using the first insulating cover layers as an etching resist and a potassium hydroxide aqueous solution (see FIG. 5(f)). In this manner, the semiconductive layers were formed in the patterns independent of each other in correspondence to the rectangular plan shapes of the first insulating cover layers to be located at the same positions as the first insulating cover layers.

Then, a second insulating cover layer was formed on the insulating base layer to cover the first insulating cover layers in the rear end-side terminal portion formation region and cover the conductive pattern in the middle region and the front-end-side terminal portion formation region, so that an insulating cover layer composed of the first insulating cover layers and the second insulating cover layer was formed in the foregoing pattern (see FIG. 5(g)). The thickness of the second insulating cover layer was 5.0 μm.

Thereafter, the metal supporting board was cut out by chemical etching to form a gimbal and then trimmed to form the terminal portion formation regions and the middle region, whereby a suspension board with circuit was obtained (see FIG. 1). In the suspension board with circuit, the resistance value between the pair of wires and the metal supporting board was 1 to $10^8$ Ω/□.

Comparative Example 1

A suspension board with circuit was produced in the same manner as in Example 1 except that the base openings and the ground connection portions were not provided, the first insulating cover layers were not provided, either, and the semiconductive layer was not etched (see FIGS. 11 and 12).

That is, the semiconductive layer was formed continuously between the insulating cover layer and each of the wires, the insulating base layer, and the metal supporting board.

(Evaluation)

Endurance Test (Short Circuit of Conductive Pattern and Ion Migration of Stainless Steel of Metal Supporting Board)

To each of the suspension boards with circuits obtained in Example 1 and Comparative Example 1, a voltage of 6 V was applied for 1000 hours in an atmosphere at 85° C. and 85% RH.

As a result, the short circuit of the conductive pattern was not observed in the suspension board with circuit of Example 1 even when 1000 hours or more elapsed. By contrast, in the suspension board with circuit of Comparative Example 1, the short circuit of the conductive pattern was observed when 320 hours elapsed.

As a result of performing sectional SEM observation and element analysis with respect to the suspension board with circuits of Example 1 and Comparative Example 1 after a lapse of 1000 hours in the endurance test performed under the foregoing conditions, the result confirmed that ion migration of stainless steel of the metal supporting board to the insulating cover layer did not occur in Example 1. By contrast, in the suspension board with circuit of Comparative Example 1, the result confirmed that ion migration of stainless steel of the metal supporting board to the insulating cover layer.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
a metal supporting board;
an insulating layer formed on the metal supporting board;
a conductive layer formed on the insulating layer and having a plurality of wires arranged in mutually spaced-apart relation; and
a plurality of semiconductive layers formed on the insulating layer and on the respective wires of the conductive pattern, and electrically connected to the metal supporting board and the respective wires,
wherein the semiconductive layers include at least one semiconductive layer independently provided for one of the wires,
wherein the independently provided semiconductive layers are disposed so as to be spaced-apart in the longitudinal direction of the wired circuit board and wherein each of the semiconductive layers has an overlapping portion in a direction orthogonal to the longitudinal direction of the wired circuit board when projected in the longitudinal direction.

2. A wired circuit board comprising:
a metal supporting board;
an insulating layer formed on the metal supporting board;
a conductive pattern formed on the insulating layer and having a plurality of wires arranged in mutually spaced-apart relation; and
a plurality of semiconductive layers formed on the insulating layer and electrically connected to the metal supporting board and the respective wires, wherein
the semiconductive layers are provided independently of each other in correspondence to the respective wires;
wherein a plurality of openings are formed in the insulating layer to extend through in a thickness direction in correspondence to the respective wires, and
a plurality of ground connection portions are formed on the metal supporting board exposed from the respective openings in contact relation with the metal supporting board and the respective semiconductive layers.

* * * * *